United States Patent [19]

Fay

[11] Patent Number: 4,543,538
[45] Date of Patent: Sep. 24, 1985

[54] COMPLEMENTARY OUTPUT AMPLIFIER WITH AN INPUT FOR OFFSETTING VOLTAGES

[75] Inventor: Richard D. Fay, Jackson, Mo.

[73] Assignee: Lenco, Inc., Jackson, Mo.

[21] Appl. No.: 631,190

[22] Filed: Jul. 16, 1984

[51] Int. Cl.⁴ .............................................. H03F 3/45
[52] U.S. Cl. .................................... 330/260; 330/261; 330/252
[58] Field of Search ............... 330/252, 255, 259, 260, 330/261, 258

[56] References Cited

U.S. PATENT DOCUMENTS

| | | | |
|---|---|---|---|
| Re. 27,351 | 5/1972 | McGraw et al. | 330/261 |
| 3,260,947 | 7/1966 | Dorsman | 330/260 |
| 3,566,298 | 2/1971 | Stevens | 330/258 |
| 3,938,055 | 2/1976 | Buhler | 330/261 |
| 4,088,961 | 5/1978 | Ashley | 330/258 |

*Primary Examiner*—James B. Mullins
*Assistant Examiner*—G. Wan
*Attorney, Agent, or Firm*—Haverstock, Garrett & Roberts

[57] ABSTRACT

An amplifier circuit having first, second and third inputs and first and second input impedance elements connected respectively to the first and second inputs, a first differential stage connected between the first and second input impedance elements, first and second output stages connected to the differential stage outputs, the first and second output stages produce complementary voltage output signals on respective first and second outputs, first and second cross-coupled differential feedback loops linking the first output to the second input of the first differential stage and the second output to the first input of the first differential stage, the first and second outputs are linked to each other by a voltage divider circuit the midpoint of which is connected to one input of a second differential stage, the third input being the other input of the second differential stage, the output of the second differential amplifier causing a change in a current repeater circuit which in turn causes a change in the first and second output stages, and the changes in the output stages operating to cancel inphase noise and insert common mode portions into the complementary output signals.

11 Claims, 3 Drawing Figures

COMPLEMENTARY OUTPUT AMPLIFIER WITH AN INPUT FOR OFFSETTING VOLTAGES

SUMMARY OF THE INVENTION

The present invention relates generally to a complementary output, dual feedback amplifier with an input for offsetting voltages which is especially useful for amplifying audio and other signals. Its low noise characteristics make it ideal for use in professional audio systems such as recording and broadcast studios which utilize complementary drive signals, although it may readily be used for other audio and non-audio applications. It is particularly applicable for use where a specified offset of the complementary outputs is required or where a carrier signal is to be mixed into the output signal.

More specifically, the device is an improved audio amplifier constructed of discrete electrical components which has three signal inputs, two complementary outputs, two primary differential feedback loops and one common mode feedback loop. The present device has two signal inputs, each with an impedance matching and gain setting resistor to match the input impedance of the present device with the output impedance of a signal source and to set the gain of the device. After passing through the input resistors, the inputs are fed into a differential input stage which amplifies differential signals present on the two inputs. Each of the two outputs from the differential input stage is applied to a controlled current source thereby forming a push-pull drive stage at each side of the differential input stage. The output of each push-pull drive stage is applied to a push-pull output stage. Thus, each input signal of the present amplifier is compared to the other input signal and the common mode signals therebetween rejected and the differential signals amplified by a differential/push-pull stage. The resultant signals are amplified by the output stage. The construction of each side of the amplifier is balanced such that the signal path from a first input to a first output is similar to that from a second input to a second output.

Two primary feedback loops are present, each loop containing a passive impedance element. The feedback loops are cross-coupled, one loop linking the first output to the second input and the other loop linking the second output to the first input.

A second differential stage in the present invention serves to balance the two outputs around a reference voltage value and to remove in phase noise from the output signal. One input of the second differential stage serves as a reference voltage input which may be connected to ground or to any desired d.c. offset voltage. It may also serve as an a.c. input such as for carrier signals. The second input of this second differential stage is linked to the two amplifier outputs through a voltage divider network preferably containing two resistors connected in a T formation, at the midpoint of which appears the common mode portion of the complementary output signals. This second differential stage is connected to a current repeater or current mirror which controls the current flow of the above-described controlled current source. Any voltage differences between the reference voltage input and the sum of the output voltages are amplified by this second differential stage. The output of the second differential stage causes a change in the current through the current repeater which in turn effects changes in the currents of the controlled current source, thereby causing a voltage change to take place simultaneously at both output stages, thus forcing the common mode portion of the output signals to assume the reference voltage value. The present circuit will maintain the desired common mode voltage at the outputs, and in the same manner will also enable a.c. signals which are applied to the reference input to be mixed into the output signals. Noise generated by the circuit elements of the present invention which occurs in phase with both output signals is detected and cancelled by this second differential stage.

A second embodiment of the present invention contains an input circuit connected across the two differential input stage inputs at an intermediate location between each input resistor and each input of the input differential stage which circuit serves to cancel the effect of common mode signals at the differential inputs. The input circuit is formed of two voltage divider networks and an inverting amplifier which is connected between the midpoint connections of the voltage dividers. When signals are applied to the amplifier inputs, the first voltage divider network detects common mode portions of the signals which common mode portions may be caused by irregularties in the signal source or by mismatched gain setting resistors at the amplifier inputs. These common mode portions are inverted by the inverting amplifier and applied back to each input lead in equal amounts by the second voltage divider network. The effects of common mode signals are thereby cancelled before they reach the input differential stage, thereby giving even better amplifier performance for the present invention.

The present device may be used in many amplifier applications, and particularly in audio systems such as radio, T.V., and recording studios. The present amplifier circuit offers the extra advantage of cancelling in-phase noise and is able to accept either balanced or unbalanced inputs and from them create differential outputs balanced around ground or some other d.c. voltage value, all with a single gain stage.

PRIOR ART

The closest known prior art to the present invention is disclosed in Parrish U.S. Pat. No. 4,242,741 which discloses a Floating Shunt Seismic Amplifier. The Parrish device is a direct current, low impedance, floating shunt amplifier formed of two operational amplifiers. The Parrish amplifier has dual, cross-coupled feedback loops and a voltage divider network connected across the two outputs, the midpoint of which ties back to the negative inputs of the two operational amplifiers.

The present invention is distinguishable over the Parrish amplifier circuitry in many important respects including that it has a single gain stage constructed of discrete elements which cannot be exactly modelled with operational amplifiers, while the Parrish device teaches away from a fully integrated signal architecture and requires the use of at least two operational amplifiers. Both the present device and the Parrish device average the two output voltages at the midpoint of a voltage divider network. However, in the present device the average of the outputs is compared to a reference signal present at a third input port while the Parrish device compares the averaged output signal to each of the input signals. The present device enables voltages to be input into the device at a third input so that it will appear as a common mode voltage at the outputs. The Parrish amplifier does not disclose a means to do this. The present device also enables carrier signals or other signals to be input into it such that the carrier or other signal appears at the outputs mixed with the output signal. Parrish does not have this feature. The current repeater circuit in conjunction with the voltage divider circuit and the second differential pair enables the present amplifier construction to cancel almost all of the inphase noise. The Parrish device does not contain a current repeater and second differential pair for cancellation of inphase noise. Another distinguishing feature of the present invention is the input impedance matching resistors, which operate to set the precise gain of the device. A further distinguishing feature of the present invention is the common mode cancelling circuit at the amplifier inputs which is not shown in Parrish. These and other features of the present device distinguish it over the Parrish device.

Another prior art construction that is of interest is the balanced output operational amplifier disclosed in Marsh et al U.S. Pat. No. 3,786,362. The Marsh et al patent is of interest because it discloses the use of a reference circuit for comparing a common mode signal from the balanced outputs to a reference signal, thereby controlling the operation of the active loads. However, the Marsh et al circuit, unlike the present construction, does not have a pair of cross-coupled differential feedback loops linking the outputs to the inputs. The present device has gain setting input resistors, which are not included in the Marsh et al device and the Marsh et al circuit has nothing similar to the input circuit of the present construction. The present device does not use resistors with the active load transistors while the Marsh et al construction requires resistors 17 and 18. The present device also does not require the use of Q3 and Q4 transistors as is disclosed in Marsh et al. Also, the construction of the current sources and the output stages of the present device are different than that disclosed in Marsh et al.

Thus neither Parrish nor Marsh et al recognized the virtues and advantages obtained by combining in a single novel amplifier circuit a pair of negative cross coupled feedback circuits, a reference circuit in conjunction with a voltage divider circuit, and a novel input circuit as set forth in the present construction.

OBJECTS

It is therefore a principal object of the present invention to teach the construction and operation of an amplifier circuit which substantially reduces noise and other distortion.

Another object is to teach the construction of a circuit for audio and related systems which can be operated in many different kinds of systems and system circuits with reduced noise and other distortion characteristics.

Another object is to teach the construction and operation of a novel amplifier circuit having dual output and dual feedback characteristics.

Another object is to substantially reduce or eliminate inphase noise in amplifier circuits such as solid state audio amplifier circuits.

Another object is to teach the construction of an amplifier having improved noise and other distortion characteristics as well as self-correcting d.c. offset voltage characteristics.

Another object is to teach the construction of an amplifier which can be used in many different environments including audio applications.

Another object of the present device is to construct an improved electronic amplifier.

Another object of the present device is to provide an electronic amplifier which enables carrier signals or d.c. offset voltages to be applied to a separate input and thereafter appear at the amplifier outputs mixed with the output signals.

Another object of the present device is to construct an improved distribution amplifier comprising a single stage.

Another object of the present device is to construct an improved audio amplifier of discrete electronic elements.

Another object of the present device is to construct an electronic amplifier having high common mode rejection.

Another object of the present device is to construct an electronic amplifier having a controllable d.c. offset.

Another object of the present invention is to construct an operational amplifier having two complementary outputs.

BRIEF DESCRIPTION OF THE DRAWINGS

These and other objects and advantages of the present invention will become apparent to those skilled in the art after consideration of the following detailed specification of several preferred embodiments of the present invention in conjunction with the accompanying drawings, wherein.

DESCRIPTION OF THE PREFERRED EMBODIMENT

Figure 1:
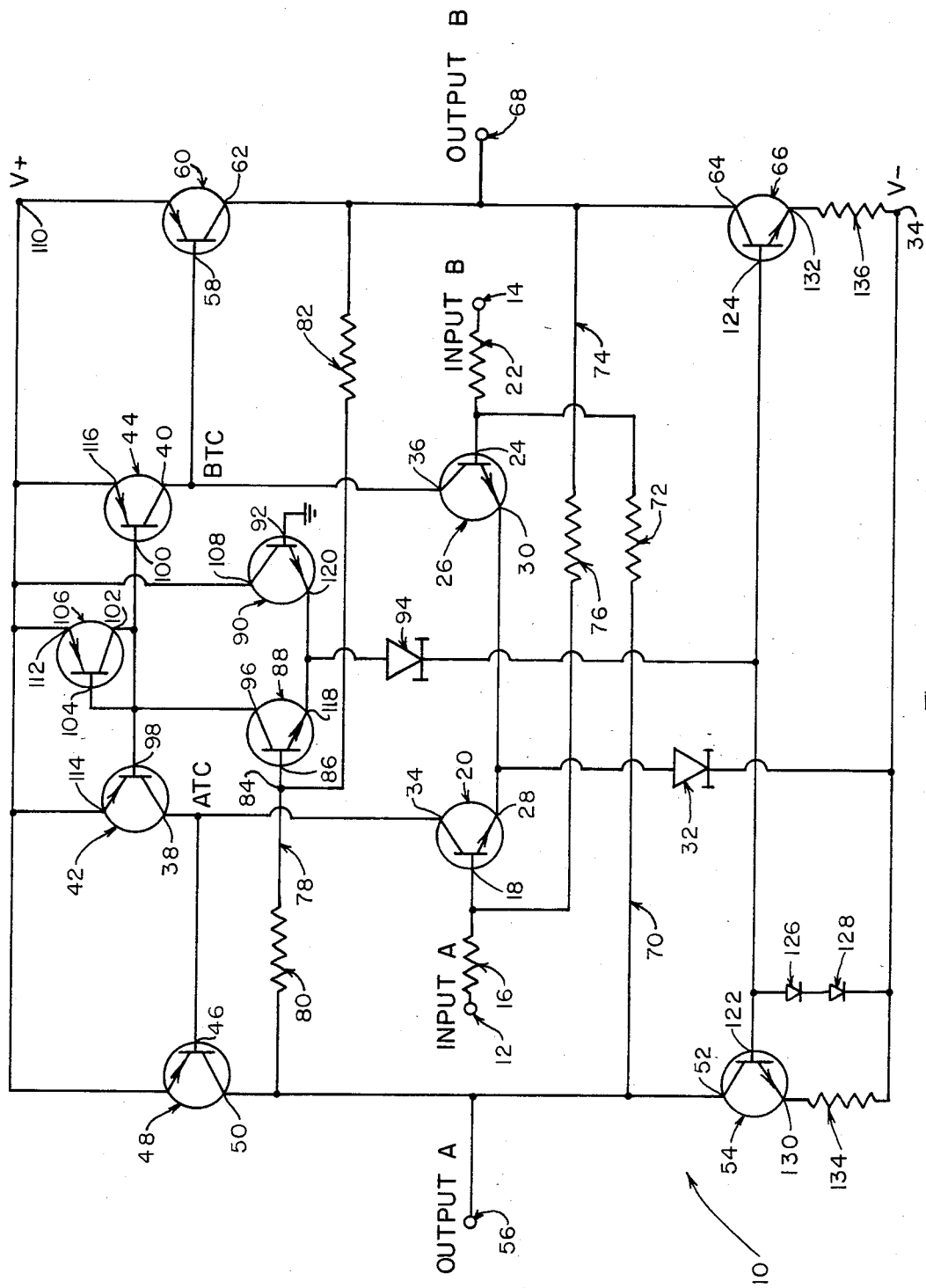
FIG. 1 is an electronic diagram of the complementary output amplifier with an input for offsetting voltages constructed according to the present invention.

Referring to the drawings more particularly by reference numbers, wherein like numerals refer to like parts, FIG. 1 shows a complementary output amplifier with an offsetting voltage input 10 constructed according to the teachings of the present invention. The device 10 includes a first input 12 and a second input 14, labeled INPUT A and INPUT $\dot{B}$ respectively on the drawing, which inputs 12 and 14 act as voltage inputs. The inputs 12 and 14 are designed to accept a pair of complementary voltage signals balanced around ground although signals balanced around another d.c. voltage, an a.c. voltage or even unbalanced signals may be used effectively. The input 12 is connected through an input impedance matching resistor 16 to a base terminal 18 of transistor 20, which base operates as a first current input. The input 14 is connected through an input impedance matching resistor 22 to a base terminal 24 of transistor 26, which serves as a second current input. The distinction between voltage inputs and current inputs becomes more important in relation to the feedback circuits and common mode cancelling circuit discussed hereinafter. The input resistors 16 and 22 also serve to set the gain of the present device. An emitter terminal 28 of the transistor 20 and an emitter terminal 30 of the transistor 26 are connected to each other and to one side of a constant current source, such as current regulator diode 32 shown in the present embodiment, the other side of which is connected to a negative power supply 34. The transistors 20 and 26, which are shown as N-P-N bipolar junction transistors, thus form an emitter coupled differential amplifier pair, amplifying the difference between the signals present at INPUTS A and B. The current source 32 increases the common mode rejection of the differential pair 20 and 26.

Collector terminals 34 and 36 of the transistors 20 and 26 are connected, respectively, to collector terminals 38 and 40 of transistors 42 and 44 which transistors 42 and 44 are shown as P-N-P bipolar junction transistors. The transistors 20 and 42 act as a push-pull amplifier stage, feeding base 46 of transistor 48. However, the transistor 42 operates within a more limited range than does the transistor 20 due to the fact that the collector-to-emitter voltage of the transistor 42 in a typical application is limited to approximately 0.8 volts by the Q point base-emitter voltage of the transistor 48. The transistor 48 amplifies the sum of the collector currents from the transistor 20 and the transistor 42. Collector terminal 50 of the P-N-P transistor 48 is connected to a collector terminal 52 of N-P-N transistor 54 such that the transistors 48 and 54 form a push-pull stage for the first output 56. In similar fashion, the transistors 26 and 44 form a push-pull stage which feeds base 58 of transistor 60 such that the transistor 44 is forced to operate within a 0.8 volt range due to the transistor 60. Collector terminal 62 of the transistor 60 is likewise connected to collector 64 of another transistor 66 forming a push-pull output stage for a second output 68.

The first output 56, labeled OUTPUT A in FIG. 1, is connected to the second current input at the base 24 of the transistor 26 through a feedback loop 70 containing a feedback resistor 72. The second output 68, labeled OUTPUT B in FIG. 1, is connected to the first current input at the base 18 of the transistor 20 through another feedback loop 74 containing a feedback resistor 76. Feedback loops 70 and 74 may also contain other types of circuit elements as well. Thus, the differential signal at OUTPUT A is fed back to INPUT B and the differential signal at OUTPUT B is fed back to INPUT A thereby cancelling distortion through negative differential feedback.

OUTPUTS A and B are linked by a voltage divider circuit 78 formed of resistors 80 and 82 and an intermediate location 84 therebetween. An average voltage from the two outputs appears at the intermediate location 84, which, for complementary output signals, is the offset voltage or common mode portion of the two signals. The intermediate location 84 is connected to base terminal 86 of transistor 88, which in conjunction with transistor 90 forms a second emitter coupled differential amplifier that operates to compare the common mode portion of the complementary output signals at OUTPUTS A and B to a reference voltage being applied to base 92 of transistor 90. For any voltage differences between the actual common mode signal at the outputs and the reference input voltage value, the transistors 88 and 90 generate a difference signal which causes the actual common mode signal at the output to assume the reference voltage value. Any common signals between the bases 86 and 92, respectively, of the second differential pair 88 and 90 are rejected by said second differential pair operating with the aid of a current source, such as current regulator diode 94.

Any differential signals generated by the second differential pair occur at collector terminal 96 of the transistor 88 which is connected to bases 98 and 100 of the transistors 42 and 44, respectively, and to collector 102 and base 104 of a current mirror or current repeater transistor 106. Collector terminal 108 of the transistor 90 is connected to a positive power source 110. The current mirror 106 is formed by connecting the base 104 and the collector 102 of the transistor 106 to the bases 98 and 100 of the respective transistors 42 and 44, and by connecting emitter 112 of the current mirror 106 to the emitters 114 and 116 of the respective transistors 42 and 44. This causes the currents flowing into the emitter terminals 114 and 116 of the transistors 42 and 44, respectively, to be approximately equal. Thus, it can be seen that a common mode signal which is different than the desired common mode voltage value being input into the base 92 of the transistor 90, occurring at the complementary outputs of the amplifier will be detected by the differential pair 88 and 90, which in turn will cause a change in current flowing through the current mirror 106 and a corresponding change in emitter currents in the transistors 42 and 44. As described above, a balancing of the collector currents of the transistors 20 and 42 and the transistors 26 and 44 occurs. The interconnection of the respective collectors 34 and 38, and 36 and 40, is referred to as the trim compensation points, labeled respectively ATC and BTC in FIG. 1. The currents resulting in these trim compensation points are applied to the two output stages of the amplifier which causes a change in the common mode portion of the complementary output signals.

Emitters 118 and 120, respectively, of the second differential transistor pair 88 and 90 are tied together and to one side of the current regulating diode 94, the other side of which diodes is connected to base terminals 122 and 124 of the output transistors 54 and 66. The base terminals 122 and 124 are also connected to a pair of diodes 126 and 128 in series connection which are forwardly biased by being tied to the negative power source 34. Emitter terminals 130 and 132 of the transistors 54 and 66 are linked to the negative power source 34 through resistors 134 and 136, respectively. The transistors 54 and 66, respectively, form current sources for the output transistors 48 and 60.

Figure 2:
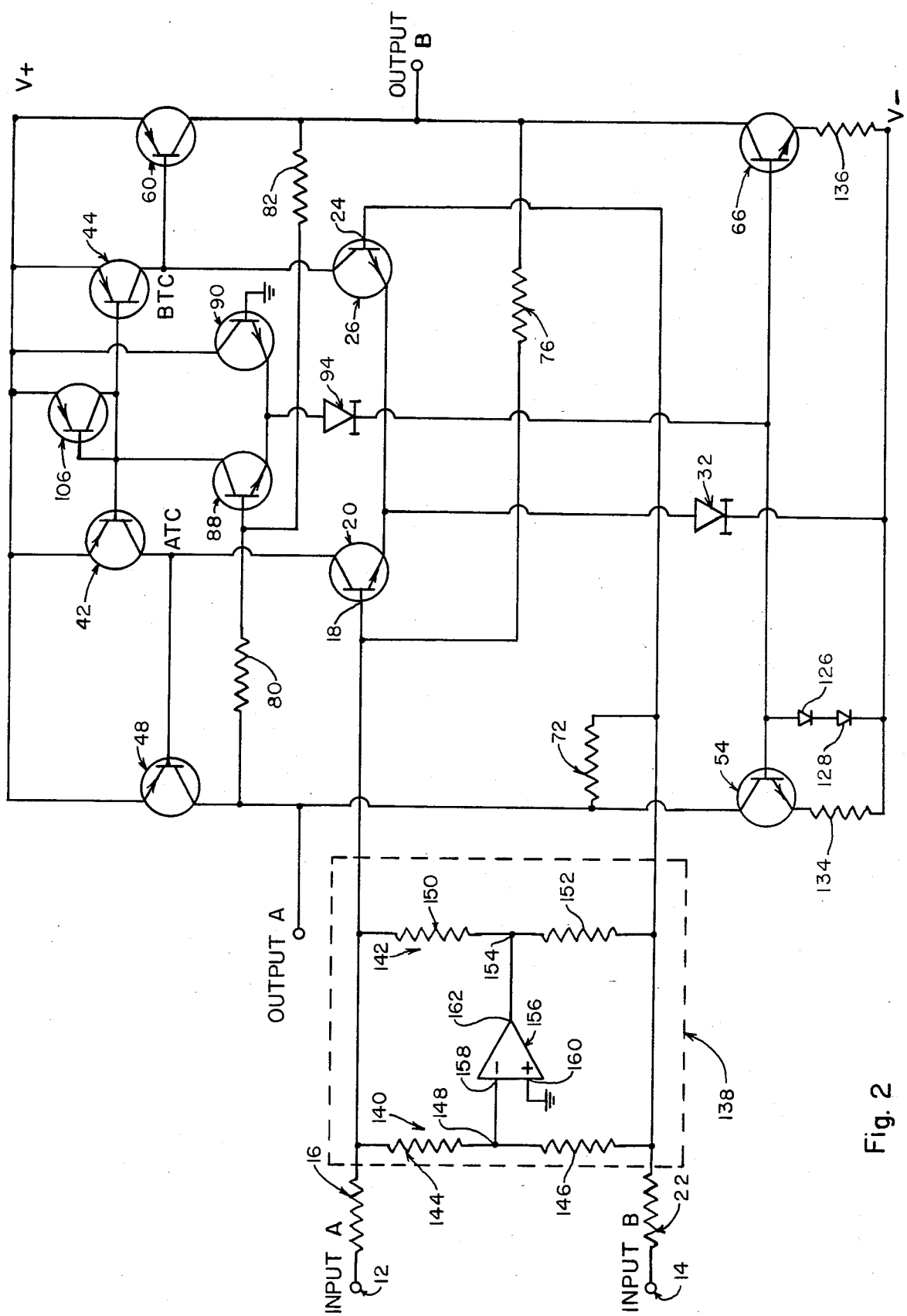
FIG. 2 is another embodiment of the present invention including a common mode cancelling input circuit.

A second embodiment of the present invention, shown in FIG. 2, includes a common mode cancelling circuit 138 connected across the bases 18 and 24, respectively, of the input differential transistor pair 20 and 26. The common mode cancelling circuit consists of two voltage divider circuits 140 and 142, the first having a pair of passive circuit elements 144 and 146 and a midpoint 148 therebetween. The common mode cancelling circuit 138 is connected across the two current inputs 18 and 24 of the device 10 of FIG. 1 between the input resistors 16 and 22 and the bases 18 and 24 of the input differential transistor pair 20 and 26. In the preferred embodiment, the first voltage divider circuit 140 comprises the two resistors 144 and 146, which are of equal value and are preferably relatively large impedance resistors. The second voltage divider circuit 142 which is connected closer to the bases 18 and 24 of the input differential pair 20 and 26 than is the first voltage divider circuit 140, also has two resistors 150 and 152 of equal value with an intermediate connection point 154 therebetween. In the preferred embodiment, the resistors 150 and 152 are of the same resistance value as the input resistors 16 and 22.

Connected between the midpoints 148 and 154, respectively, of the voltage divider circuits 140 and 142 is an inverting circuit, such as the inverting operational amplifier 156 depicted in FIG. 2. The operational amplifier, or OP AMP, 156 may be a standard OP AMP which is commonly available as an integrated circuit or an inverting amplifier formed of discrete elements. It has two inputs, one of which is shown as an inverting input 158, to which the midpoint 148 is connected, and the other is shown as a non-inverting input 160, which in the present embodiment is shown connected to ground. An output 162 of the OP AMP 156 is connected to the midpoint 154 of the second voltage divider circuit 142. The embodiment depicted in FIG. 2 operates to cancel incoming common mode signals more completely than does the embodiment of FIG. 1.

Figure 3:
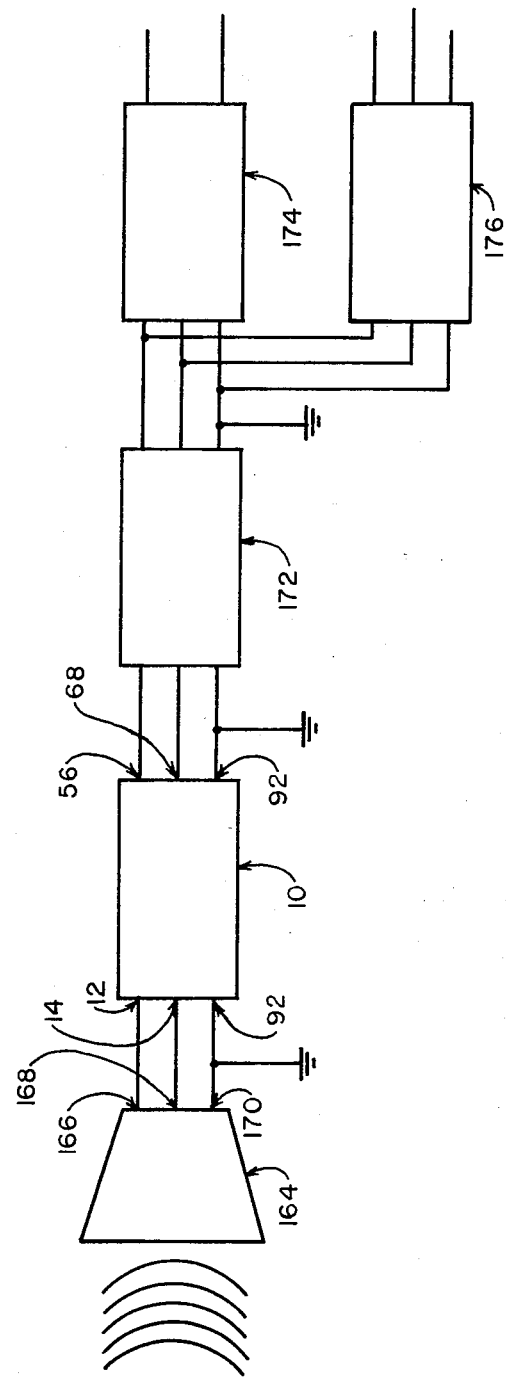
FIG. 3 is a block diagram showing the device of FIG. 1 or FIG. 2 in a typical application.

FIG. 3 is a block diagram showing the dual output, feedback amplifier of the present invention in a typical application such as in a recording studio application. The present invention is shown functioning as a low noise pre-amplifier for a microphone 164 wherein the microphone output leads 166 and 168, including a grounded lead 170, are connected to the inputs 12 and 14 and the offset reference 92 of the present device 10; and the outputs 56 and 68, including the grounded lead 92, of the present device 10 are connected to a mixing console 172 which in turn is connected to a power amplifier 174 or to a magnetic tape recorder 176. Other uses foreseen for the present invention include using it as a pre-amplifier for a phonograph cartridge, as a part of a frequency band equalizer, as a distribution amplifier, as an audio power amplifier, as a part of a mixing console or in audio processing equipment such as an audio compressor or expander or as a head amplifier in a magnetic tape player/recorder.

The present circuit operates as follows: an input signal, such as a signal from an audio microphone, is presented to the input terminals of the device. Ordinarily the signal will be a complementary drive, which is a standard signal format of the audio industry consisting of three leads, a first and second lead having thereon complementary signals and a third lead which serves as a ground. The signals on the first and second leads are ideally mirror images of each other, the voltage on the first lead moving toward the positive direction as the voltage on the second lead moves toward the negative direction at the same rate and to the same extent, and vice versa. The input signals may not always be balanced, however, or may become unbalanced by the use of mismatched input resistors and that is one reason for the reference voltage input of the present device. It is also possible to feed non-complementary input signals into the present device, such as by tying one input to ground or to any other voltage and feeding a signal into the other input terminal, and still get balanced complementary signals at the amplifier outputs.

The input signals are applied to the first differential amplifier comprising transistors 20 and 26 and the current regulator diode 32. This amplifier pair amplifies only the differences between the input signals and rejects common mode signals. The two outputs of the differential amplifier are located at the collectors 34 and 36, respectively, of the transistors 20 and 26. The output signals are applied to the collectors 38 and 40 of the transistors 42 and 44 where the collector currents are balanced and then applied to the bases 46 and 58, respectively, of the transistors 48 and 60. The resultant difference signals produced by the input differential pair are amplified by the two push-pull output stages comprising, respectively, the transistors 48 and 54 and the transistors 60 and 66 which feed the OUTPUT A and OUTPUT B, respectively. Signals produced by the two output stages are cross-coupled to the two inputs by the feedback loops 70 and 74 to eliminate distortion of the signal by the circuit. The common mode signal of two outputs are sensed by the output sensing resistors 80 and 82 which average the voltage occurring at the two outputs, and apply the average voltage to the one input 86 of the second differential stage comprising the transistors 88 and 90 and the current regulating diode 94. The other input 92 of the second differential stage has connected thereto a reference voltage or desired common mode signal. The outputs of the second differential stage are applied across current mirror configuration transistor 106. In this circuit, the current mirror transistor 106 acts to equalize the emitter currents of the transistors 42 and 44, thereby balancing the respective portions of the present amplifier which correspond to the INPUT A/OUTPUT A side and to the INPUT B/OUTPUT B side so that the output signals are complementary. This second differential stage along with sensing resistors 80 and 82, acts in a common mode feedback manner to eliminate noise at the outputs which occurs inphase with the output signals. The base 92 of the transistor 90 of the second differential pair may also serve as an input port for desired common mode signals such as d.c. offset level voltages or for carrier signals, which are to occur at the output.

The input circuit 138 shown in FIG. 2 operates as follows: a common mode portion of the two complementary input signals appears at the midpoint 148 of the first divider network where it is applied to the inverting input 158 of the amplifier 156. The inverted output signal appearing at the output 162 of the inverting amplifier 156 is applied in equal amounts to the respective amplifier current inputs by the second divider network 142, thereby cancelling any common mode portion of the input signals.

The device of the present invention may be constructed of discrete components or it may be formed into an integrated circuit. In a preferred embodiment, it is formed of discrete components which have been potted as by embedding in a plastic substance, which spreads the heat generated by the circuit evenly for more uniform operation. When potted, the present circuit constitutes a small package with only the inputs and outputs external to the potting material. The present device, either potted or unpotted, is particularly useful as a plug in module.

Thus, there has been shown and described a novel circuit for amplifying electronic signals such as audio signals which are applied to a pair of amplifier inputs in order to produce a pair of complementary output signals on a pair of amplifier outputs, which circuit fulfills all the objects and advantages sought therefor. Many changes, modifications, variations and other uses and applications of the present construction will, however, become apparent to those skilled in the art after considering this specification and the accompanying drawings. All such changes, modifications, variations and other uses and applications which do not depart from the spirit and scope of the invention are deemed to be covered by the invention which is limited only by the claims which follow.

What is claimed is:

1. An amplifier circuit having first and second inputs, first and second outputs, a first differential pair of active elements connected between the first and second inputs, a first negative feedback circuit connected between the second output and a first active element of the first differential pair, a second negative feedback circuit connected between the first output and a second active element of the first differential pair, first and second output stages associated respectively with the first and second outputs and respectively connected to said active elements of said first differential pair, a voltage divider circuit connected between the first and second outputs, said voltage divider having an intermediate connection location, a reference circuit including a second differential pair of active elements, a reference input port connected to one of the active elements of said second pair, said intermediate connection location of the voltage divider circuit connected to the other active element of said second pair, other active elements respectively connected to the active elements of the first differential pair and to the active elements of the reference circuit, said other active elements responding to variations occurring across the reference circuit and operating in conjunction with the first and second output stages to cancel in phase signals and noise appearing on the first and second outputs, and circuit means operatively connected to the active elements of said first differential pair, to said other active elements and to the reference circuit active elements to maintain them in their operation conditions.

2. The amplifier circuit of claim 1 wherein the circuit means operatively connected to the active elements includes current source means, current regulator means and means to make the circuit relatively stable with temperature variations.

3. The amplifier circuit of claim 1 wherein said first and second inputs include first and second input circuits of passive circuit elements.

4. The amplifier circuit of claim 1 including circuit elements connected across the first and second inputs and linking said first input to said second input.

5. The amplifier circuit of claim 4 wherein said circuit elements include first and second voltage divider circuits each having an intermediate connection and an inverting active circuit element connected between the intermediate connections.

6. The amplifier circuit of claim 5 wherein said first voltage divider circuit is formed of two series connected passive impedance elements of substantially equal value and said second voltage divider circuit is formed of two other series connected passive impedance elements of substantially equal value.

7. The amplifier circuit of claim 6 wherein the impedance of said two series connected impedance elements is greater than the impedance of said other series connected impedance elements.

8. The amplifier circuit of claim 1 wherein said first differential pair of active elements and said second differential pair of active elements each include an emitter coupled transistor pair.

9. An amplifier circuit comprising a first differential circuit including a pair of active current controlled elements connected in series with associated impedance elements, a pair of input terminals connected across the first differential circuit, a first current source connected to the said active current controlled elements, a first pair of output active elements operatively connected to one of the active current controlled elements of the first differential circuit, a second pair of output active elements operatively connected to the other active current controlled element of the first differential circuit, a first negative feedback circuit connected between the circuit of the second pair of output active elements and the circuit associated with the one active element of the first differential circuit, a second negative feedback circuit connected between the circuit of the first pair of output active elements and the circuit associated with the other active element of the first differential circuit, a voltage divider circuit having a first connection to the circuit of the first pair of output active elements, a second connection to the circuit of the second pair of output active elements, and an intermediate connection, a second current source, a control pair of differentially connected active elements having a first connection to the intermediate connection, a second connection to the second current source and a third connection, and input means to the third connection to establish a control condition on the intermediate connection.

10. An amplifier circuit having first, second and third input locations, and first and second output locations comprising,
    first and second input impedance elements,
    a first pair of differentially connected active elements connected in series with respective ones of the first and second input impedance elements across the first and second input locations,
    first and second push-pull circuit stages connected respectively to the first and second output locations,
    a first negative feedback circuit having a first connection to the first output location and a second connection to the second input location,
    a second negative feedback circuit having a first connection to the second location and a second connection to the first input location,
    a voltage divider circuit having a first end connection to the first output location, a second end connection to the second output location, and an intermediate connection,
    a reference circuit including a pair of differentially connected active elements, the reference circuit having a first end connection to the intermediate location of the voltage divider circuit, a second end connection to the third input location, the third input operating as a reference input, and an intermediate connection,
    a current source connected to the intermediate connection of the reference circuit,
    and circuit means to maintain the active circuit elements in their operating conditions.

11. The amplifier circuit of claim 10 including an input circuit connected between the first and second input impedance elements and the respective connections to the first pair of differentially connected active elements, said input circuit including parallel connected voltage divider circuits each including a first impedance element connected to the first input impendence element and a second impedance element connected to the second input impedance element, each of said parallel connected voltage divider circuits having an intermediate connection location, and an inverting amplifier circuit having input and output connections connected respectively to the intermediate connection locations of the voltage divider circuits.

* * * * *

UNITED STATES PATENT OFFICE
CERTIFICATE OF CORRECTION

Patent No. 4,543,538    Dated September 24, 1985

Inventor(s) Richard D. Fay

It is certified that error appears in the above-identified patent and that said Letters Patent are hereby corrected as shown below:

Column 10, line 17, "connection" should be --location--.

Column 10, line 36, after "second" (first occurrence) insert --output--.

Signed and Sealed this

Tenth Day of December 1985

[SEAL]

Attest:

DONALD J. QUIGG

Attesting Officer    Commissioner of Patents and Trademarks